(12) United States Patent
Ding et al.

(10) Patent No.: US 6,294,812 B1
(45) Date of Patent: Sep. 25, 2001

(54) HIGH DENSITY FLASH MEMORY CELL

(75) Inventors: Yen-Lin Ding; Gary Hong, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/306,119

(22) Filed: May 6, 1999

(51) Int. Cl.$^7$ ................................................ H01L 29/788
(52) U.S. Cl. ................................................ 257/321; 438/264
(58) Field of Search ................................. 438/261, 264; 365/185.11; 257/315, 316, 321

(56) References Cited

U.S. PATENT DOCUMENTS

| | | | |
|---|---|---|---|
| 5,429,960 | * 7/1995 | Hong | 437/35 |
| 5,457,061 | * 10/1995 | Hong et al. | 438/261 |
| 5,851,881 | * 12/1998 | Lin et al. | 438/261 |
| 5,918,125 | * 6/1999 | Guo et al. | 438/264 |
| 5,972,752 | * 10/1999 | Hong | 438/264 |
| 5,978,264 | * 11/1999 | Onakado et al. | 365/185.11 |

* cited by examiner

Primary Examiner—Olik Chaudhuri
Assistant Examiner—Marcos S. Pizarro-Crespo
(74) Attorney, Agent, or Firm—Jiawei Huang; J. C. Patents

(57) ABSTRACT

A flash memory cell. A spacer is formed on a sidewall of a controlling gate. A self-aligned source/drain region can thus be formed by the formation of the spacer. The tunneling oxide layer is then formed on the source/drain region instead of on the controlling gate. Thus, the tunneling oxide layer is formed with a self-aligned process.

22 Claims, 8 Drawing Sheets

HIGH DENSITY FLASH MEMORY CELL

CROSS-REFERENCE TO RELATED APPLICATION

This application claims the priority benefit of Taiwan application Ser. No. 88105507, filed Apr. 7, 1999, the full disclosure of which is incorporated herein by reference.

BACKGROUND OF THE INVENTION

1. Field of the Invention

The invention relates to a flash memory cell, and more particularly, to a high density flash memory cell with a self-aligned tunneling window.

2. Description of the Related Art

Recently, the wide application of memories with a high density in many fields have evoked a great attention. One of the reasons is that the memory cell and the fabrication cost can be greatly reduced. However, using the conventional local oxidation isolation (LOCOS) technique restricts the development of the fabrication technique in the deep submicron process.

The development of shallow trench isolation has resolved the restriction of the local oxidation isolation technique. A memory with a high density can be fabricated with a further shrunk dimension.

In a conventional flash memory cell, a tunneling oxide layer is formed between a controlling gate and a floating gate instead of being formed on the surface of the source/drain region. Therefore, the electron is tunneled in and out of the floating gate by way of a semiconductor channel. The way of electron tunneling comprises a Fowler Nordheim (FN) tunneling, a channel hot electron injection (CHEI), a band-to-band tunneling induced hot carrier injection (BBHC), or other mechanism.

No matter which way of electron tunneling is employed, an operation voltage has to reach a certain value during a reading, programming, or erasing process. Thus causes a restriction of layout.

SUMMARY OF THE INVENTION

Accordingly, the invention provides a flash memory cell. The flash memory cell comprises a self-aligned source and drain regions formed to advantage a fabrication process with further shrinking linewidth. That is, by the self-aligned fabrication process, the source and drain regions can be formed with a small dimension. Moreover, by a self-aligned forming step, a tunneling layer is formed directly on the source and drain region. As consequence, the tunneling layer can be formed with a length ranged between 500 Å to 2000 Å. Over the channel region between the drain region and the source region, a gate oxide layer is formed with a length of about 0.1 to 0.5 μm. With such a small tunneling window of the self-aligned source/drain region, the tunneling effect is thus enhanced.

It is to be understood that both the foregoing general description and the following detailed description are exemplary and explanatory only and are not restrictive of the invention, as claimed.

DESCRIPTION OF THE PREFERRED EMBODIMENTS

Figure 1:
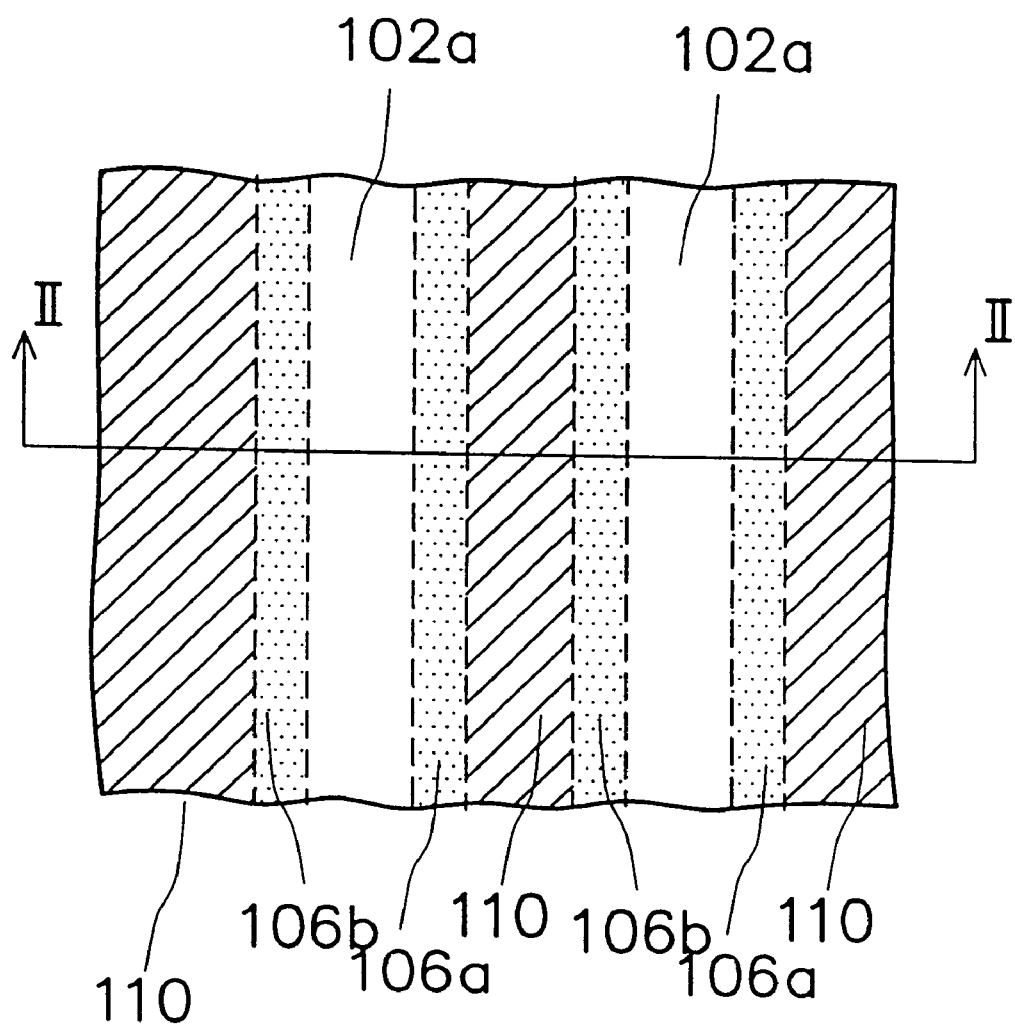
FIG. 1 shows a top view of a flash memory fabricated after the formation of a shallow trench isolation.
Figure 3:
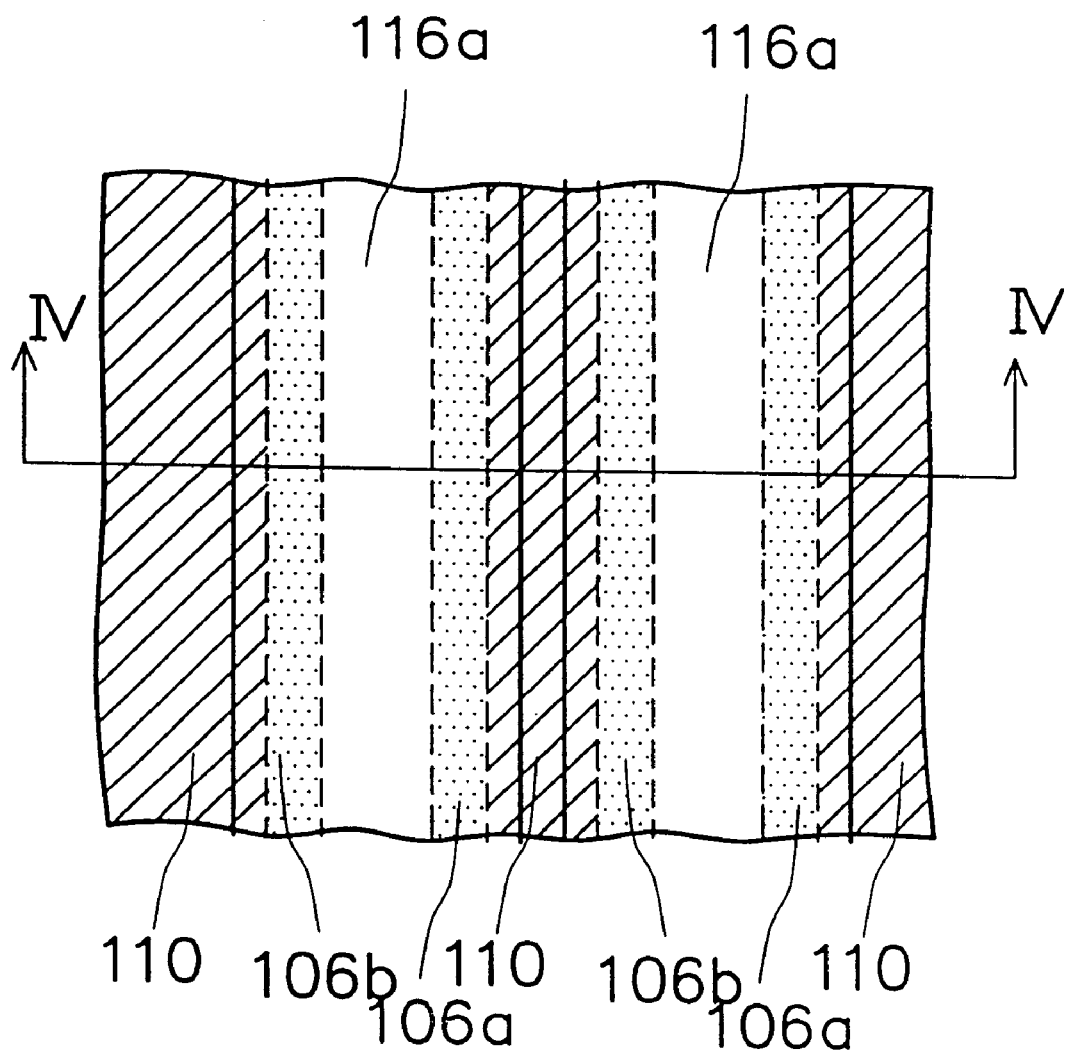
FIG. 3 shows a top view of a flash memory in which a polysilicon layer is patterned for the first time.
Figure 4A:
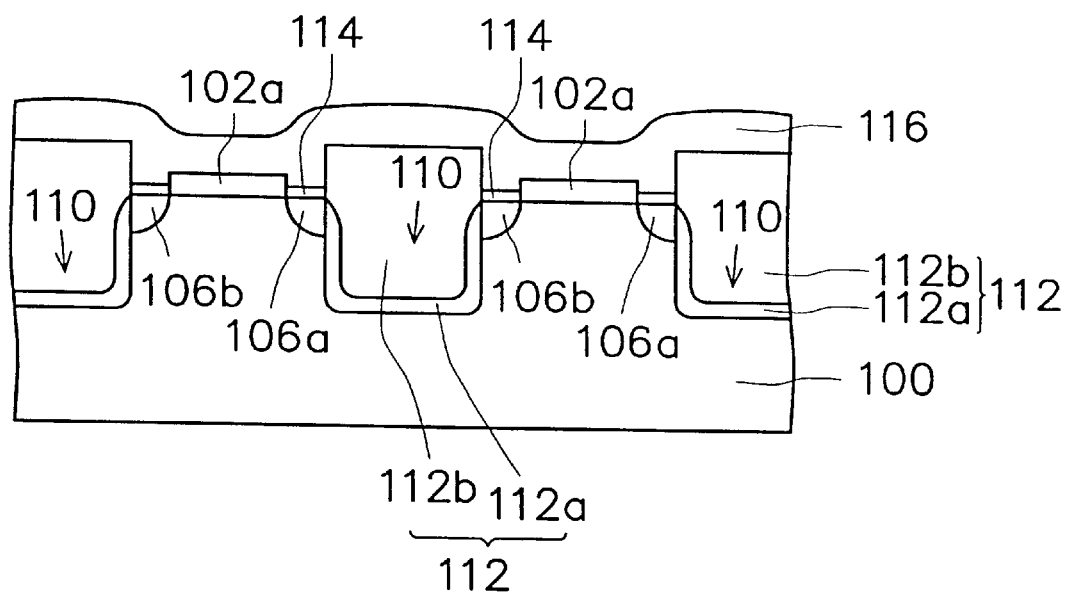
FIG. 4A to FIG. 4B are cross sectional views cutting along the line IV—IV in FIG. 3.
Figure 4B:
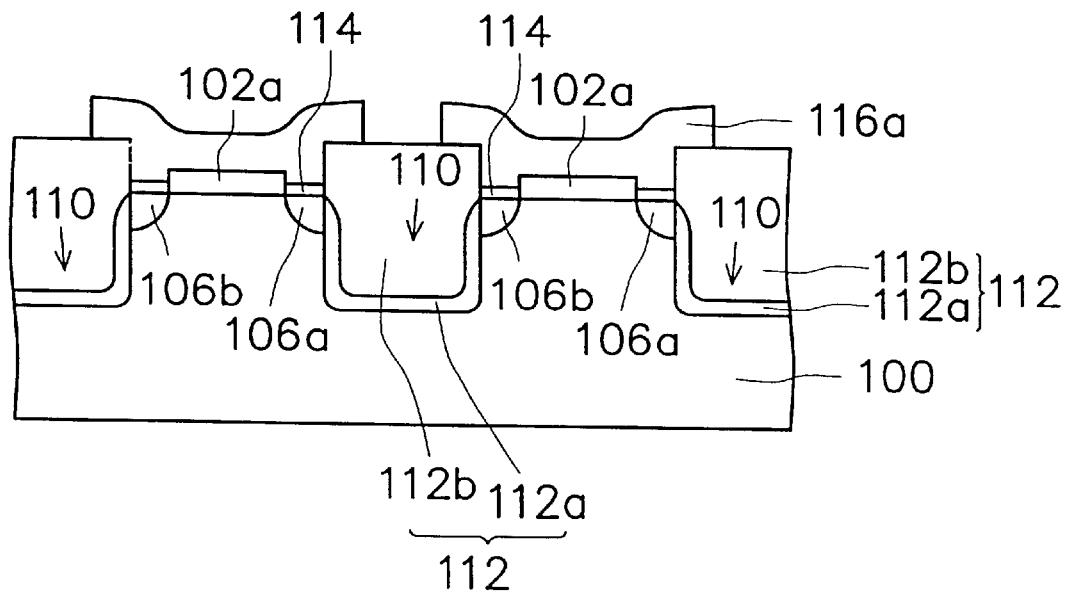
Figure 5:
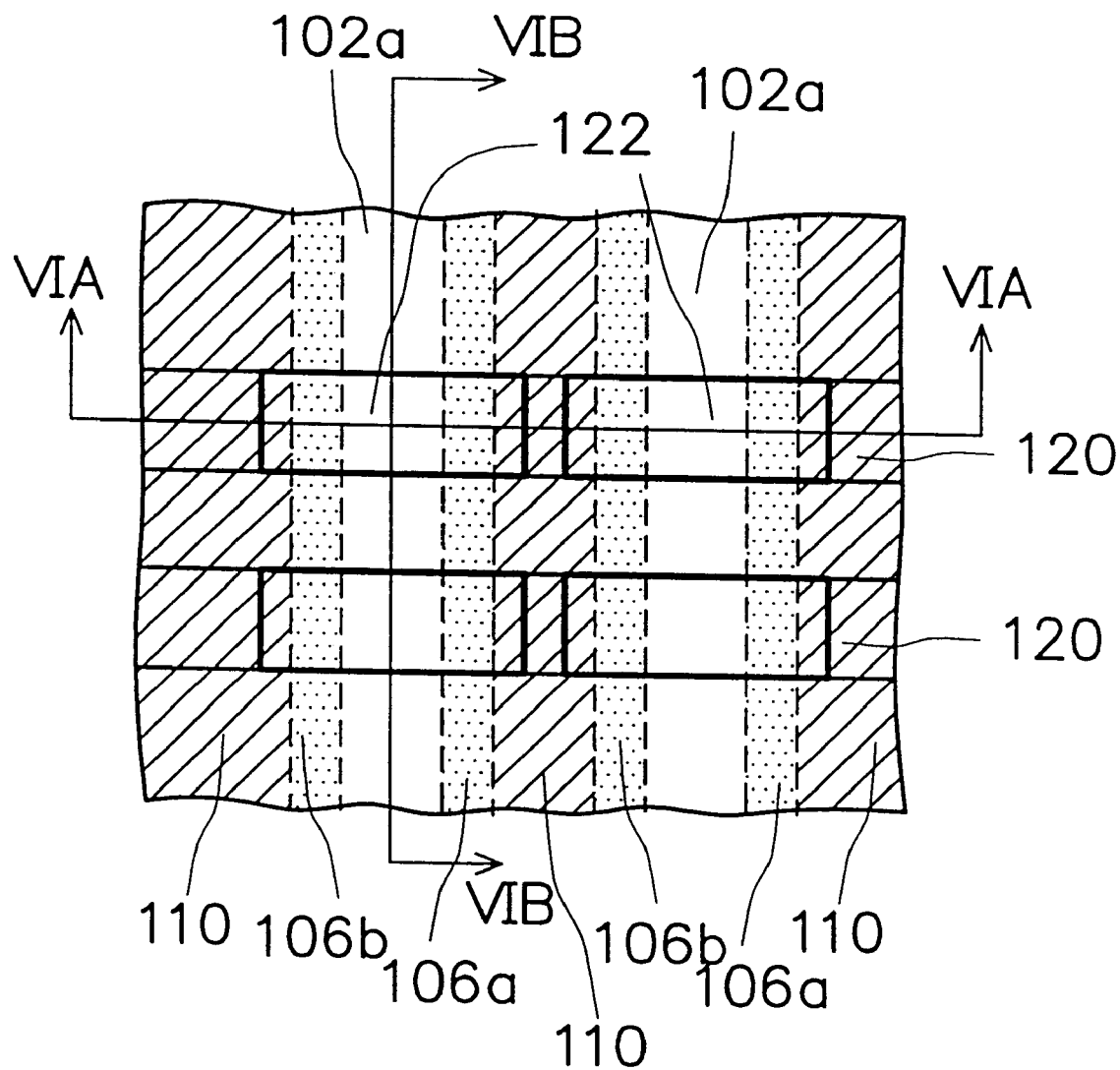
FIG. 5 shows a top view of the flash memory in which the polysilicon layer is patterned for the second time.
Figure 6A:
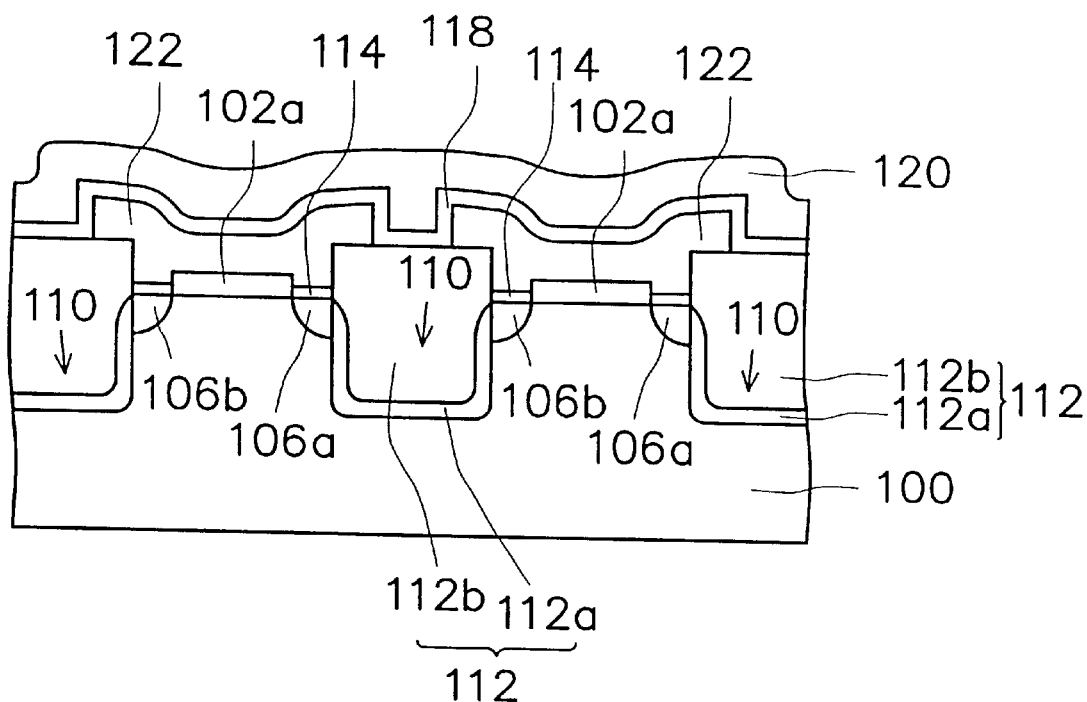
FIG. 6A to FIG. 6B are cross sectional views cutting along the line VIA—VIA and VIB—VIB in FIG. 5, respectively.
Figure 6B:
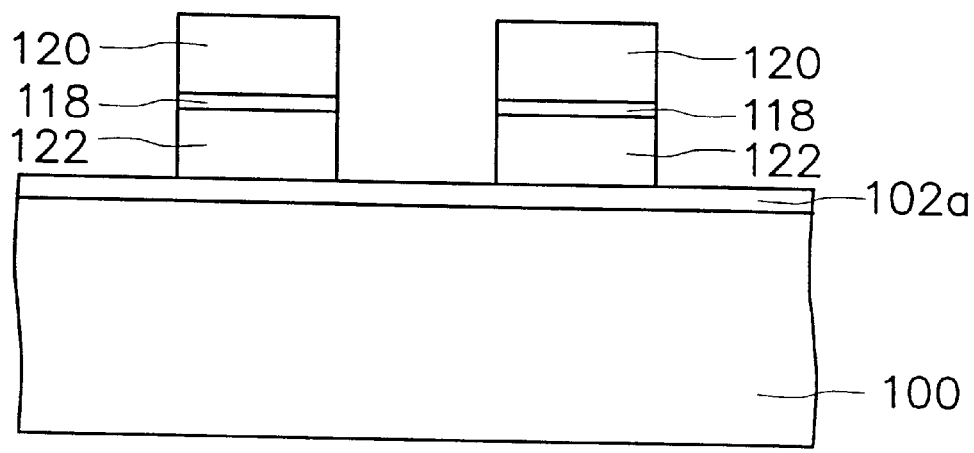

FIG. 1 shows a top view of a flash memory in which a shallow trench isolation is formed. FIG. 2A to FIG. 2F are cross sectional cutting along the line II—II in FIG. 1 and shows the fabrication process of the flash memory. FIG. 3 shows a flash memory in which a polysilicon layer to be used as a floating gate is patterned for the first time. FIG. 4A to FIG. 4B are cross sectional views showing the fabrication process of the flash memory in FIG. 3. FIG. 5 shows a flash memory in which a polysilicon layer to be used as a controlling gate is patterned and a polysilicon layer to be used as a floating gate is patterned for the second time. FIG. 6A to FIG. 6B are cross sectional views showing the fabrication process of the flash memory in FIG. 5.

Figure 2A:
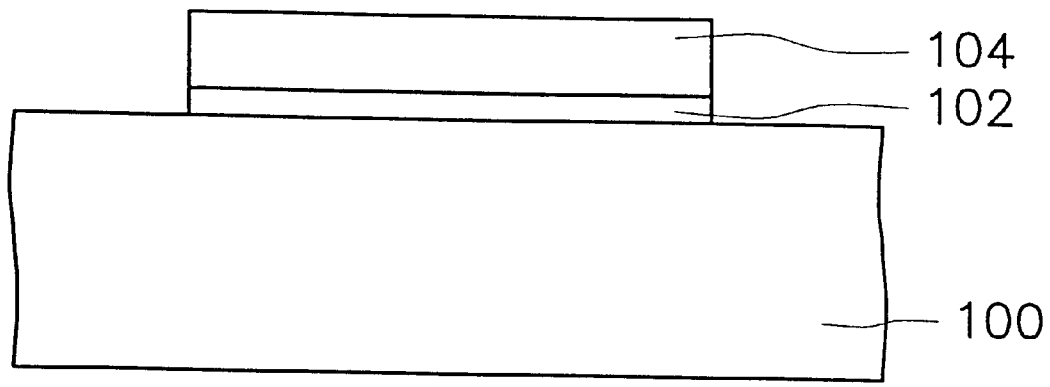
FIG. 2A to FIG. 2F are cross sectional views of FIG. 1 cutting along the line II—II.

In FIG. 2A, a gate oxide layer 102 is formed to cover a substrate 100. The substrate 100 comprises, for example, a substrate having a well structure. Preferably, the gate oxide layer 102 has a thickness of about 70 to 200 Å and the formation of the gate oxide layer 102 comprises, for example, thermal oxidation.

A dielectric layer 104 is formed on the gate oxide layer 102. The dielectric layer 104 comprises, for example, a silicon nitride layer ($SiN_x$) formed by chemical vapor deposition (CVD), preferably, by low pressure chemical vapor deposition (LPCVD).

Figure 2B:
Figure 2B:
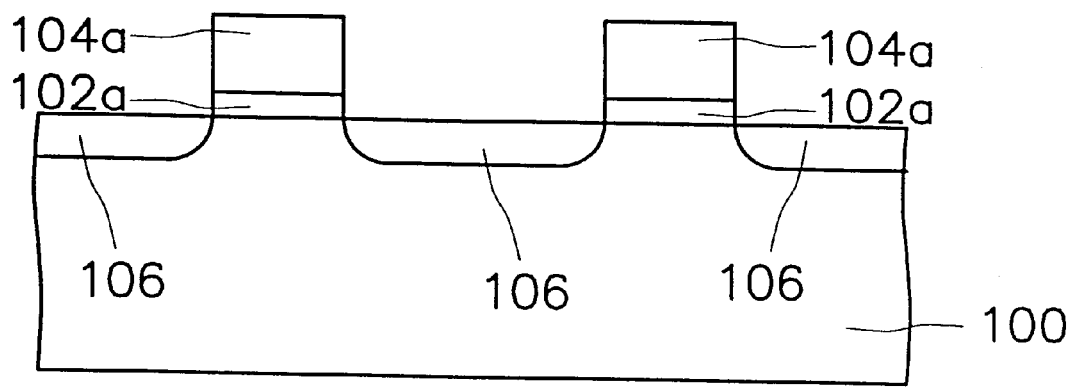

In FIG. 2B, using photolithography and etching technique, the dielectric layer 104 and the gate oxide layer 102 are patterned to define an active area (AA) 106. Being patterned, the dielectric layer and the gate oxide layer are then denoted by a reference numeral 102a and 104a, respectively.

The active area 106 is doped, for example, by an ion implantation step, with the dielectric layer 104a as a mask layer. Preferably, the ion implantation step is performed with N-type or P-type dopant such as arsenic ions (As), phosphorus ions (P), phosphine ($PH_3$), arsine ($AsH_3$), or boron trifluoride ($BF_3$).

Figure 2C:
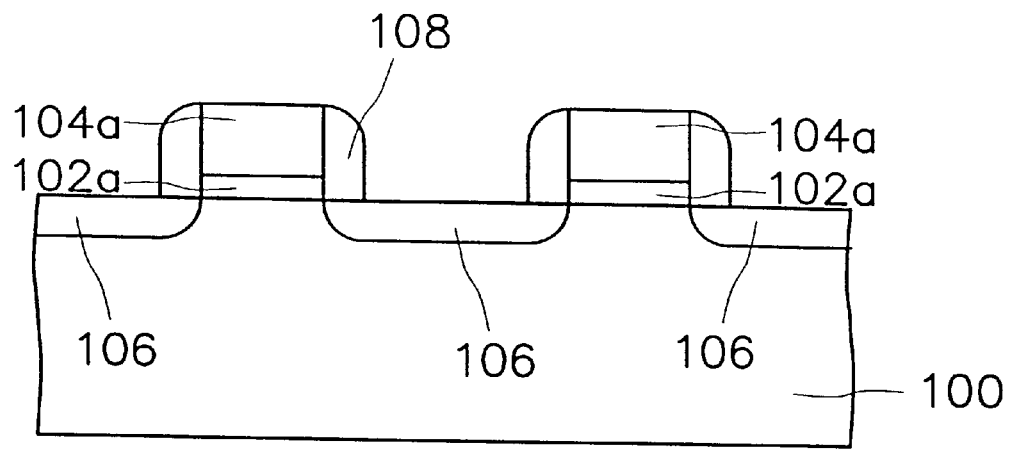

In FIG. 2C, a spacer 108 is formed on side walls of the dielectric layer 104a and the gate oxide layer 102a. The spacer 108 can be fabricated by forming a conformal dielectric layer, for example, a silicon nitride layer to cover the dielectric layer 104a, the gate oxide layer 102a, and the substrate 100 first. The conformal dielectric layer is then etched back to remain the spacer 108 on the side walls of the dielectric layer 104a and the gate oxide layer 102a only. Typically, the spacer 108 has a width of about 500 to 2000 Å, that is, the active region 106 covered by the spacer 108 is about 500 to 2000 Å wide.

Figure 2D:
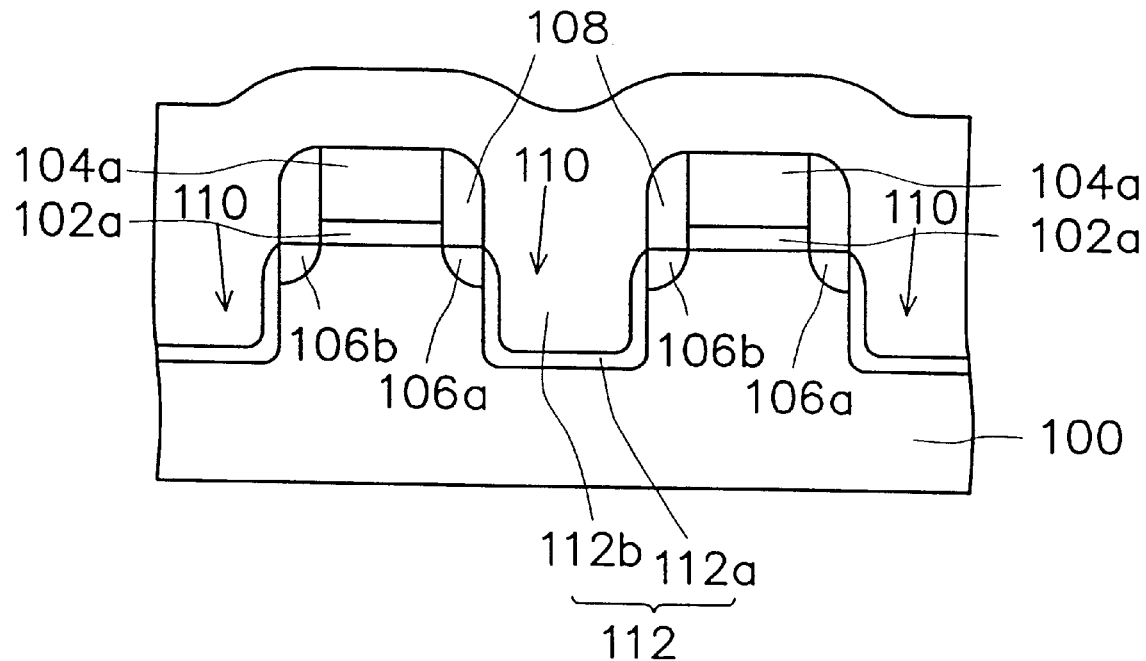

In FIG. 2D, a trench 110 is formed in the active area 106 with the dielectric layer 104a and the spacer 108 as a mask. For example, the trench 110 can be formed by using a dry etching process with different selectivities of the substrate 100 and the mask. Typically, the trench 110 has a depth much deeper compared to the doped active area 106. While forming the trench 110, a source region 106a and a drain region 106b are formed simultaneously. As mentioned above, since the active region 106 covered by the spacer 108 is about 500 to 2000 Å, thus, the width of the source region 106a and the drain region 106b is about 500 to 2000 Å. A channel region between the source region 106a and the drain region 106b is determined by the width of the resultant source region 106a and the drain region 106b. Typically, the channel region, equivalently, the gate oxide layer 102a has a length ranged between 0.1 to 0.5 μm, depending on the specific requirements.

Along the profile of the trench 110, a conformal liner oxide layer 112a is formed, for example, by thermal oxidation or low pressure chemical vapor deposition (LPCVD). An insulation layer, for example, a silicon oxide layer, is formed on the liner oxide layer 112a and fills the trench 110. The formation of the liner oxide layer 112a is to mend surface defects of the trench 110 since the insulation properties of a recovery material can be enhanced.

The method of fabricating the insulation layer 112b comprises, for example, low pressure chemical vapor deposition, or electron cyclotron resonance (ECR) chemical vapor deposition with a good filling effect and can maintain good insulation properties, inductively coupled plasma (ICP) chemical vapor deposition, or high density plasma (HDP) chemical vapor deposition.

Figure 2E:
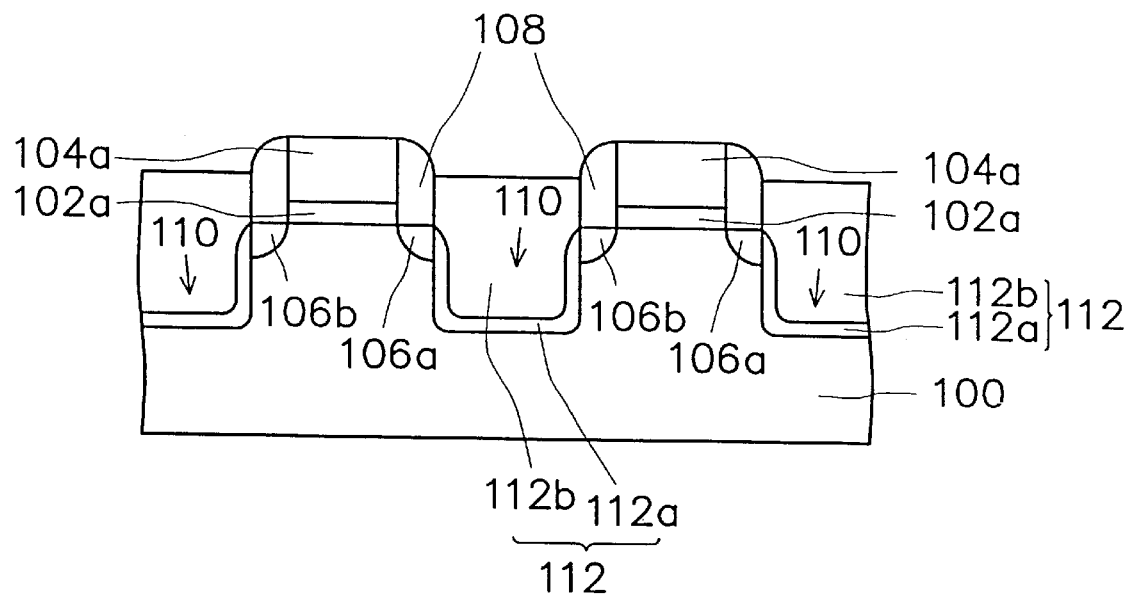

In FIG. 2E, a planarization process or an etch back process is performed to remove a part of the insulation layer 112b. The planarization process comprises, for example, a chemical mechanical polishing step (CMP) or a dry etching step with the dielectric layer 104a as a polish or etch stop. Or alternatively, after the chemical mechanical polishing step, a recess step is performed on the remaining insulation layer 112b. Whether the recess step is performed or not is dependent on the profiles of the dielectric layer 104a and he spacer 108.

Figure 2F:
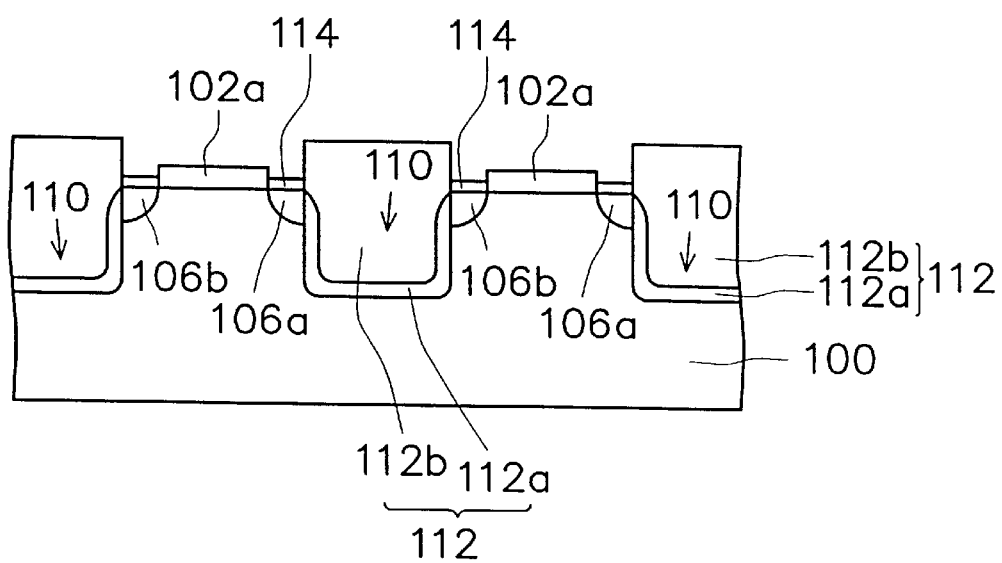

In FIG. 2F, the dielectric layer 104a and the spacer 108 are removed, for example, by wet etching, to expose the source region 106a, the drain region 106b, and the gate oxide layer 102a. A tunneling layer 114 is formed to cover the source region 106a and the drain region 106b. A preferred material for forming the tunneling layer 114 comprises a silicon oxide layer with a thickness of about 50 to 70 Å.

Preferably, the tunneling layer 114 is formed by thermal oxidation since apart from the surface of the source region 106a and the drain region 106b, there is no other region of the substrate 100 exposed. That is, the source region 106a and the drain region 106b are the only available regions to be performed with a thermal oxidation step. Therefore, the tunneling layer 114 may only be formed and self-aligned on the source region 106a and the drain region 106b.

Referring to FIG. 1, the structures mentioned above comprise a source region 106a and a drain region 106b next to each side of the trench 110. The source region 106a and the drain region 106b further comprise a self-aligned tunneling layer 114 thereon. A gate oxide layer 102a is formed on the substrate 100 between the self-aligned tunneling layer 114.

FIG. 3 shows a flash memory of which a polysilicon layer used as a floating gate is formed and patterned for a first time.

In FIG. 4A, a polysilicon layer 116 is formed over the substrate 100.

Preferably, the polysilicon layer 116 is a blanket layer formed conformal to the surface profile of the substrate 100.

In FIG. 4B, the polysilicon layer 116 is patterned to form a floating gate 116a which covers the tunneling layer 114 on the source region 106a and the drain region 106b, and the gate oxide layer 102a.

FIG. 5 shows a flash memory of which a polysilicon layer used as a controlling gate is formed and patterned.

Referring to FIG. 5, 6A and 6B, a dielectric layer 118 and a polysilicon layer 120 is formed over the substrate 100, for example, by chemical vapor deposition. The dielectric layer 118 comprises, for example, an oxide/nitride/oxide (ONO) layer.

The dielectric layer 118 is formed to block the electrons injected into the floating gate 116a to flow into the controlling gate during operation.

The polysilicon layer 120, the dielectric layer 118, and the polysilicon layer 116a are patterned. As a consequence, the polysilicon layer 116a is resulted as block or an island of floating gates 122 as shown in FIG. 5.

Referring to FIG. 5, after being patterned, the polysilicon layer 120, that is, the controlling gate is formed covering the gloating gate 122 along a direction approximately perpendicular to an extending direction of the trench 110.

The subsequent processes are well known to those skilled in the art, and thus, are not described further.

The invention uses a mask to form a shallow trench isolation. With the formation of the spacer, the size of the source/drain region can be adjusted. Furthermore, the tunneling layer can be formed and self-aligned with the source/drain region.

By the application of the shallow trench isolation, a high density flash memory device can be fabricated.

With the formation of the tunneling layer self-aligned with the source/drain region, a larger process window is obtained. Since the tunneling layer is formed on the source/drain region, a smaller tunneling window can be obtained to enhance the Fowler-Nordheim tunneling effect during the programming and erasing operations.

The invention is applicable to devices without bit line contacts.

To perform a programming operation, no voltage bias is required for the word line, whereas, a bias of about 8 volt is applied to the bit line. For an erasing operation, the bias applied to the word line is about 12 volt while the bit line is free of bias. For a reading operation, a 3 volt bias is applied to the word line and a 1 volt bias is applied to the bit line. Compared to the conventional device, the operation voltages are greatly reduced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A flash memory cell, comprising:

a substrate;

a shallow trench isolation;

a drain region and a source region adjacent to the shallow trench isolation in the substrate;

a channel region between the drain region and the source region in the substrate;

a gate oxide layer over the channel region;

a tunneling layer covering the source region and the drain region;

a floating gate, on the gate oxide layer and the tunneling layer;

a dielectric layer, on the floating gate; and a controlling gate, on the dielectric layer.

2. The flash memory cell according to claim 1, wherein the substrate comprises a well.

3. The flash memory cell according to claim 1, wherein the source region and the drain region include N-type doped regions.

4. The flash memory cell according to claim 1, wherein source and drain regions include P-type doped regions.

5. The flash memory cell according to claim 1, the tunneling layer comprises a silicon oxide layer.

6. The flash memory cell according to claim 1, wherein the gate oxide layer has a thickness of about 70 to 200 Å.

7. The flash memory cell according to claim 1, wherein the tunneling layer has a thickness of about 50 to 70 Å.

8. The flash memory cell according to claim 1, wherein each of the source region and the drain region has a width ranged between 500 to 2000 Å.

9. The flash memory cell according to claim 1, wherein the gate oxide layer has a width of about 0.1 to 0.5 μm.

10. The flash memory cell according to claim 1, wherein the floating gate includes a polysilicon layer.

11. The flash memory cell according to claim 1, wherein the controlling gate includes a polysilicon layer.

12. The flash memory cell according to claim 1, wherein the dielectric layer includes an oxide/nitride/oxide layer.

13. A flash memory cell, comprising:

a substrate;

a plurality pairs of doped regions in the substrate, each pair of the doped region being isolated by a shallow trench isolation;

a channel region, between two doped regions of each pair in the substrate;

a gate oxide layer, on the channel region on the substrate;

a tunneling layer, covering each pair of the doped region;

a first polysilicon layer, covering the tunneling layer and the gate oxide layer;

a dielectric layer, covering the first polysilicon layer; and a second polysilicon layer, covering the dielectric layer.

14. The flash memory according to claim 13, wherein the doped regions comprise a plurality of N-type doped regions.

15. The flash memory according to claim 13, wherein doped regions comprise a plurality of P-type doped regions.

16. The flash memory according to claim 13, wherein the shallow trench isolation has a depth deeper than the doped regions.

17. The flash memory according to claim 13, wherein the gate oxide layer has a thickness of about 50 to 200 Å.

18. The flash memory according to claim 13, wherein the gate oxide layer has a length of about 0.1 to 0.5 μm.

19. The flash memory according to claim 13, wherein the tunneling layer has a thickness of about 50 to 70 Å.

20. The flash memory according to claim 13, wherein each of the doped region has a length of about 500 to 2000 Å.

21. The flash memory according to claim 13, wherein the first polysilicon layer has an island or block shape on the gate oxide layer and the tunneling layer.

22. The flash memory according to claim 13, wherein the second polysilicon layer extends along a direction approximately perpendicular to a direction which the shallow trench isolation extends along.

* * * * *